United States Patent
Liu et al.

(10) Patent No.: US 9,049,664 B2
(45) Date of Patent: Jun. 2, 2015

(54) WIRELESS COMMUNICATIONS CIRCUIT FOR IMPROVING CURRENT CONSUMPTION AND RF PERFORMANCE

(71) Applicant: MEDIATEK INC., Hsin-Chu (TW)

(72) Inventors: Wei-Cheng Liu, Taoyuan County (TW); Chun-Jen Tsai, Tainan (TW); Ting-Wei Kang, Kaohsiung (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 103 days.

(21) Appl. No.: 13/924,642

(22) Filed: Jun. 24, 2013

(65) Prior Publication Data

US 2014/0378188 A1    Dec. 25, 2014

(51) Int. Cl.
*H04W 52/02* (2009.01)
*H03G 3/20* (2006.01)

(52) U.S. Cl.
CPC ............. *H04W 52/0261* (2013.01); *H03G 3/20* (2013.01)

(58) Field of Classification Search
CPC .... H03G 3/20; H04W 52/0261; H03H 2/006; H03H 7/40
USPC .......... 455/107, 115.1–115.4, 120, 121, 123, 455/127.1, 127.2, 127.3, 574
See application file for complete search history.

(56) References Cited

U.S. PATENT DOCUMENTS

| | | | |
|---|---|---|---|
| 2009/0021325 A1* | 1/2009 | Lee et al. | 333/124 |
| 2010/0321086 A1* | 12/2010 | See et al. | 327/359 |
| 2013/0154889 A1* | 6/2013 | Desclos et al. | 343/745 |

* cited by examiner

*Primary Examiner* — Nhan Le
(74) *Attorney, Agent, or Firm* — Winston Hsu; Scott Margo (57) ABSTRACT

A wireless communications circuit includes: a transceiver; a power amplifier module including a plurality of power amplifiers coupled to the transceiver; a filter module, including a plurality of filters coupled to the power amplifier module; an antenna switching module coupled between the filter module and an antenna; a tunable matching network coupled between the antenna and the antenna switching module; and a baseband circuit coupled to the tunable matching network. The baseband circuit is used for generating a control signal to the tunable matching network to adjust an impedance of the tunable matching network, wherein the impedance of the tunable matching network is adjusted to be different values under different operating conditions of the wireless communications circuit.

10 Claims, 8 Drawing Sheets

WIRELESS COMMUNICATIONS CIRCUIT FOR IMPROVING CURRENT CONSUMPTION AND RF PERFORMANCE

BACKGROUND

3G/4G mobile phones generally have a high current consumption (power consumption) resulting in short battery usage time with respect to other phones. Improving the current consumption and radio frequency (RF) performance would do much to improve the experience of users.

The front end circuit of a 3G/4G mobile phone includes at least a transceiver, a power amplifier (PA), a filter and an antenna. At present, there are three common solutions for reducing current consumption: averaging power tracking method, envelope tracking method and optimized load method. The averaging power tracking method reduces a supply voltage of the PA to increase PA efficiency. The advantages of this method are low cost and easy implementation, but the current consumption improvement is not significant when the power amplifier has a higher output power, and the averaging power tracking method cannot keep the RF performance at wireless condition. The envelope tracking method is used to track a transmitter signal envelope and provide a voltage which is related to signal envelope to the PA. The advantage of this method is better current consumption than the averaging power tracking method, but the disadvantages are higher cost, worse receiver (RX) band noise at PA output, and cannot keep the RF performance at wireless condition. The optimized load method is used to provide optimal impedance for PA output matching to obtain better efficiency and meet output power requirements. The advantage is low cost, but the disadvantages are limited current consumption and cannot keep the RF performance at wireless condition.

Regarding the above-mentioned optimized load method, the PA current consumption can ideally be optimized by tuning the PA output matching circuit based on 50 ohm loading. In a real case, however, the TX loading (impedance) is time-variant at wireless condition, and the current consumption and RF performance (e.g. the output power level or signal quality) of the PA may vary or be degraded when the user holds the phone in a different position. In addition, for different PAs, different transmitter (TX) frequencies and different PA output powers, the PA loading with best current consumption and RF performance will vary from 50 ohms.

SUMMARY

It is therefore an objective of the present invention to provide a wireless communications circuit, where the loading of the PA can be adjusted according to different operating conditions of the wireless communications circuit. The current consumption and/or other performance of the power amplifier module can be optimized to solve the problems associated with the prior art.

According to one embodiment of the present invention, a wireless communications circuit comprises: a transceiver; a power amplifier module comprising a plurality of power amplifiers coupled to the transceiver; a filter module, comprising a plurality of filters coupled to the power amplifier module; an antenna switching module coupled between the filter module and an antenna; a tunable matching network coupled between the antenna and the antenna switching module; and a baseband circuit coupled to the tunable matching network. The baseband circuit is used for generating a control signal to the tunable matching network to adjust an impedance of the tunable matching network, wherein the impedance of the tunable matching network is adjusted to be different values under different operating conditions of the wireless communications circuit.

According to another embodiment of the present invention, an impedance adjusting method of a wireless communications circuit is provided, where the wireless communications circuit comprises: a transceiver; a power amplifier module comprising a plurality of power amplifiers coupled to the transceiver; a filter module, comprising a plurality of filters coupled to the power amplifier module; an antenna switching module coupled between the filter module and an antenna; and a tunable matching network coupled between the antenna and the antenna switching module. The impedance adjusting method comprises: generating a control signal according to a condition of the wireless communications circuit; and sending the control signal to the tunable matching network to adjust an impedance of the tunable matching network; wherein the impedance of the tunable matching network is adjusted to be different values under different operating conditions of the wireless communications circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
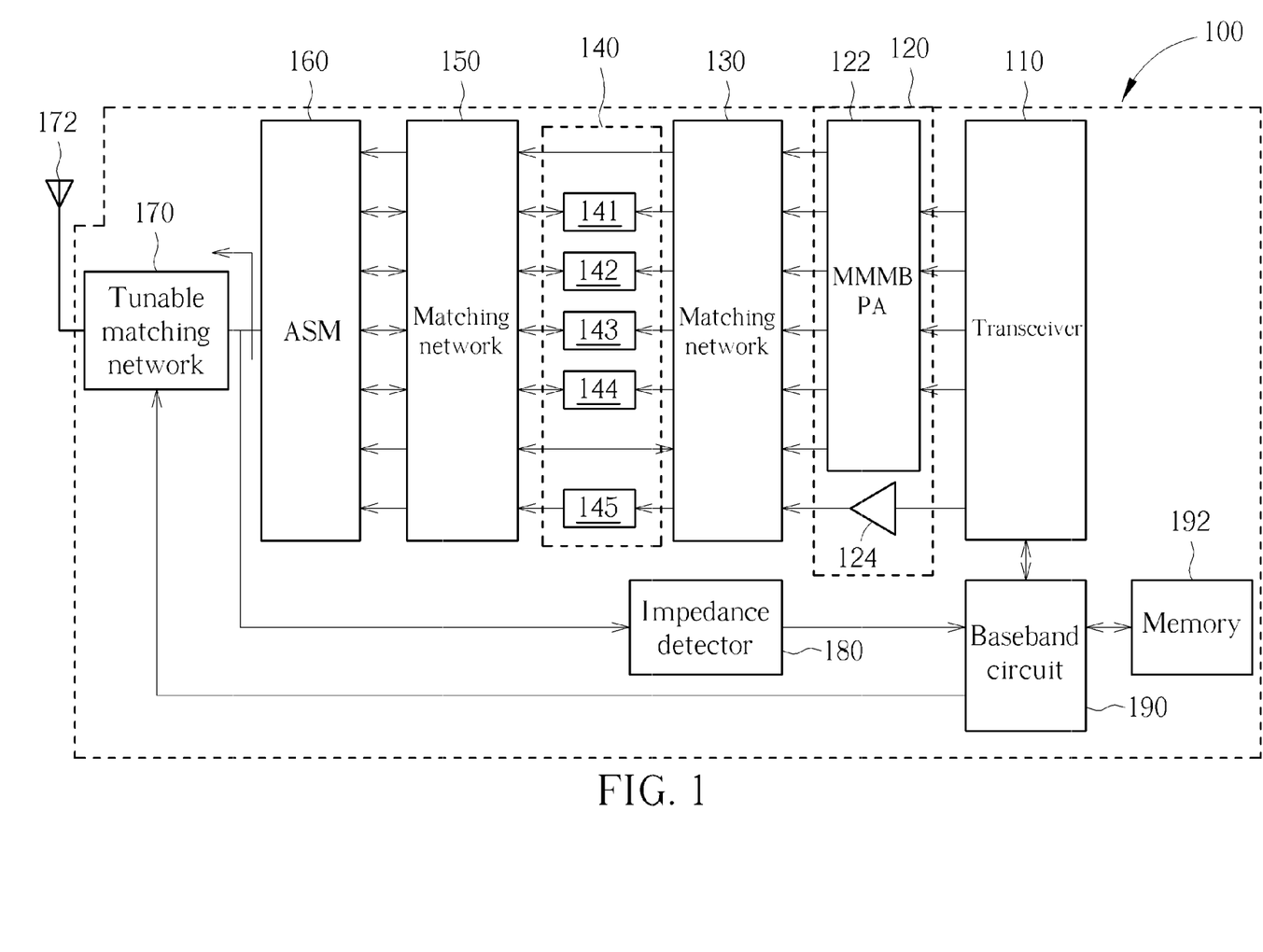
FIG. 1 is a diagram illustrating a wireless communications circuit according to one embodiment of the present invention.

Please refer to FIG. 1, which is a diagram illustrating a wireless communications circuit 100 according to one embodiment of the present invention. As shown in FIG. 1, the wireless communications circuit 100 comprises a transceiver 110, a power amplifier module 120 comprising a multi-mode/multi-band power amplifier (MMMB PA) 122 and a PA 124, a matching network 130, a filter module 140 comprising a plurality of filters (duplexers) 141-145, a matching network 150, an antenna switching module (ASM) 160, a tunable matching network 170, an impedance detector 180, a baseband circuit 190 and a memory 192. The wireless communications circuit 100 is connected to an antenna 172. In this embodiment, the wireless communications circuit 100 serves as a front end circuit of a 2G/3G/4G mobile phones. In other embodiments, the wireless communications circuit 100 can also be used in other communication systems such as Wireless Fidelity (WiFi) systems.

In this embodiment, the transceiver 110, the power amplifier module 120 and the baseband circuit 190 are three different chips, and the other elements can be implemented by chip(s), package(s) or other circuit elements positioned on a printed circuit board (PCB). In addition, in other embodiments of the present invention, the transceiver 110, the power amplifier module 120 and the baseband circuit 190 can be integrated into a single chip, or any two of them are integrated into a chip. These alternative designs shall fall within the scope of the present invention.

In the wireless communications circuit 100 shown in FIG. 1, there are a plurality of channels for different bands. For example, the MMMB PA 122 has six power amplifiers built therein and has six outputs, where these amplifiers can be used for 2G high-band, 3G/4G high-band, 3G/4G low-band, 2G low-band, etc. The matching network 130 has seven groups of matching circuits for impedance matching of the power amplifier module 120. Similarly, the matching network 150 has seven groups of matching circuits for impedance matching of the filter module 140. The ASM 160 is used to connect one of the channels (paths) to the antenna 172 via the tunable matching network 170.

The matching networks 130 and 150 are optional devices; that is, one or both can be removed from the wireless communications circuit 100 without influencing the normal operations of the wireless communications circuit 100.

Figure 2:
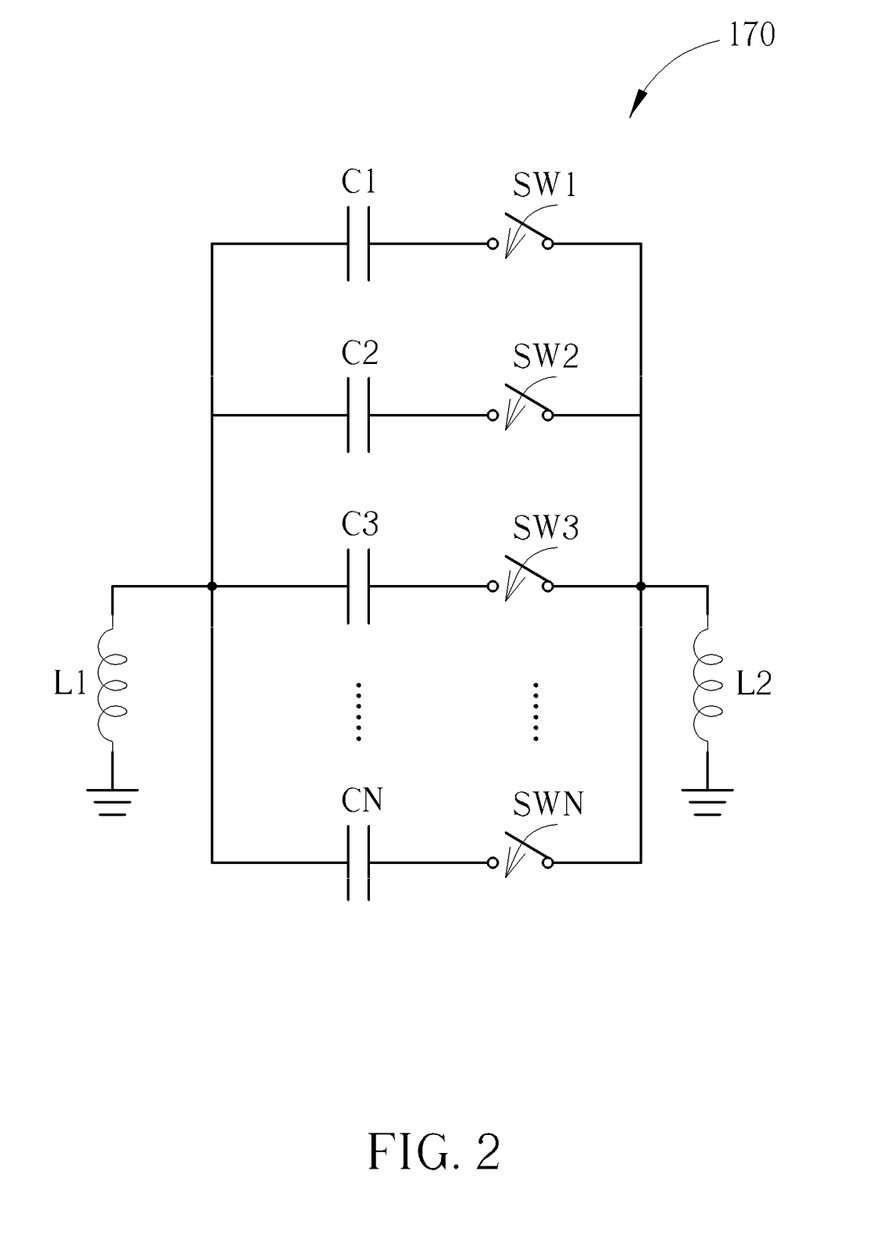
FIG. 2 is a diagram illustrating the tunable matching network shown in FIG. 1 according to one embodiment of the present invention.

Please refer to FIG. 2, which is a diagram illustrating the tunable matching network 170 according to one embodiment of the present invention. As shown in FIG. 2, the tunable matching network 170 is implemented by using switchable step capacitors and inductors. The tunable matching network 170 includes two inductors L1 and L2, a plurality of capacitors C1-CN and a plurality of switches SW1-SWN connected in parallel. The impedance of the tunable matching network 170 can be adjusted by controlling conductive states of the switches SW1-SWN. It is noted that the tunable matching network 170 shown in FIG. 2 is not a limitation of the present invention. In other embodiments, the tunable matching network 170 can also be implemented by other tunable capacitors or tunable inductors.

Figure 3:
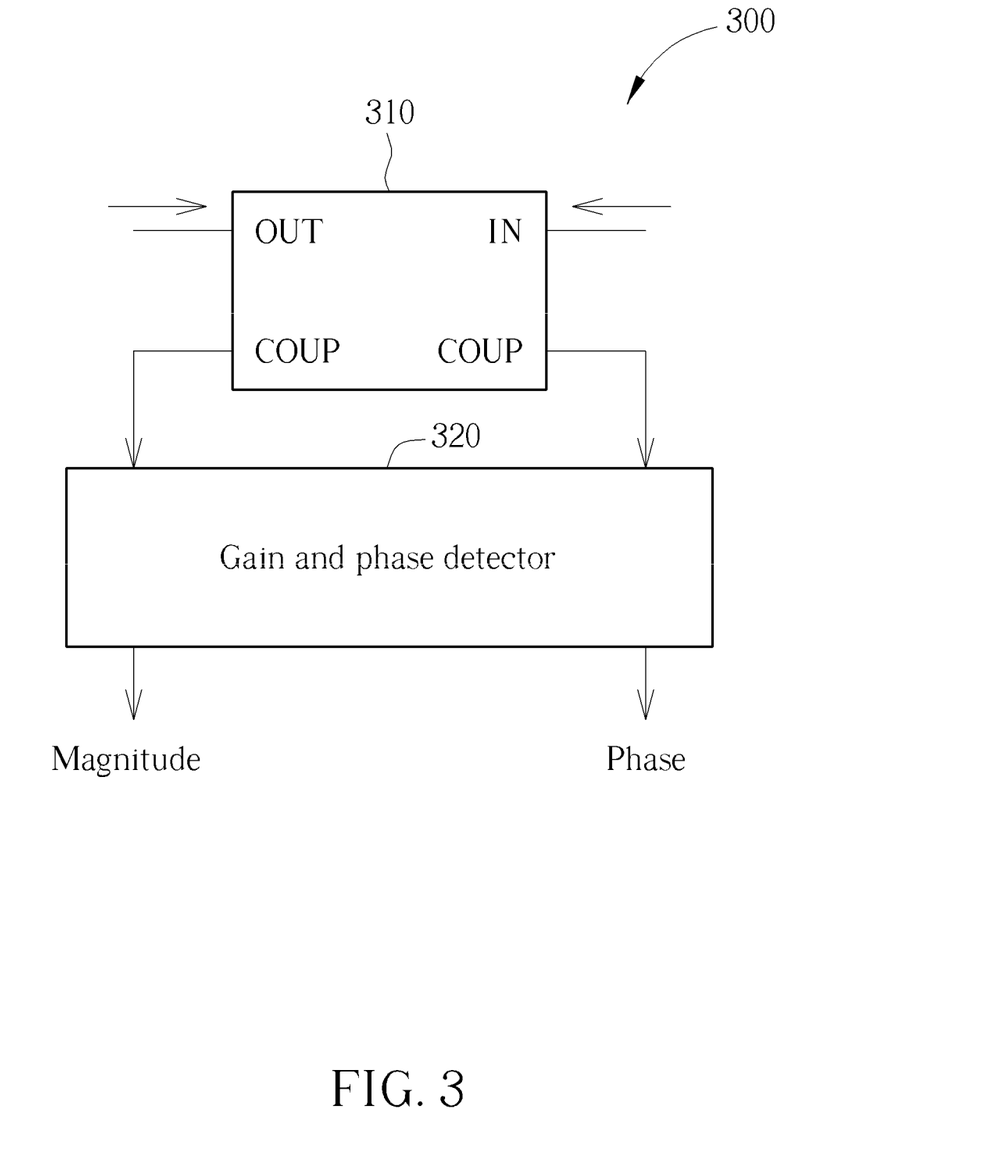
FIG. 3 is a diagram illustrating the impedance detector shown in FIG. 1 according to one embodiment of the present invention.

Please refer to FIG. 3, which is a diagram illustrating the impedance detector 300 according to one embodiment of the present invention, where the impedance detector 300 can be used to implement the impedance detector 180 shown in FIG. 1. As shown in FIG. 3, the impedance detector 300 includes a bi-directional coupler 310 and a gain and phase detector 320. In the operations of the impedance detector 300, the bi-directional coupler 310 receives a signal from the ASM 160 at a node IN, and receives another signal from the antenna 172 (via the tunable matching network 170) at a node OUT. The bi-directional coupler 310 then generates a coupled reverse signal and a coupled forward signal from nodes COUP to the gain and phase detector 320, and the gain and phase detector 320 outputs magnitude and phase information to the baseband circuit 190, where the magnitude and phase information serves as the load impedance of the ASM 160.

Figure 4:
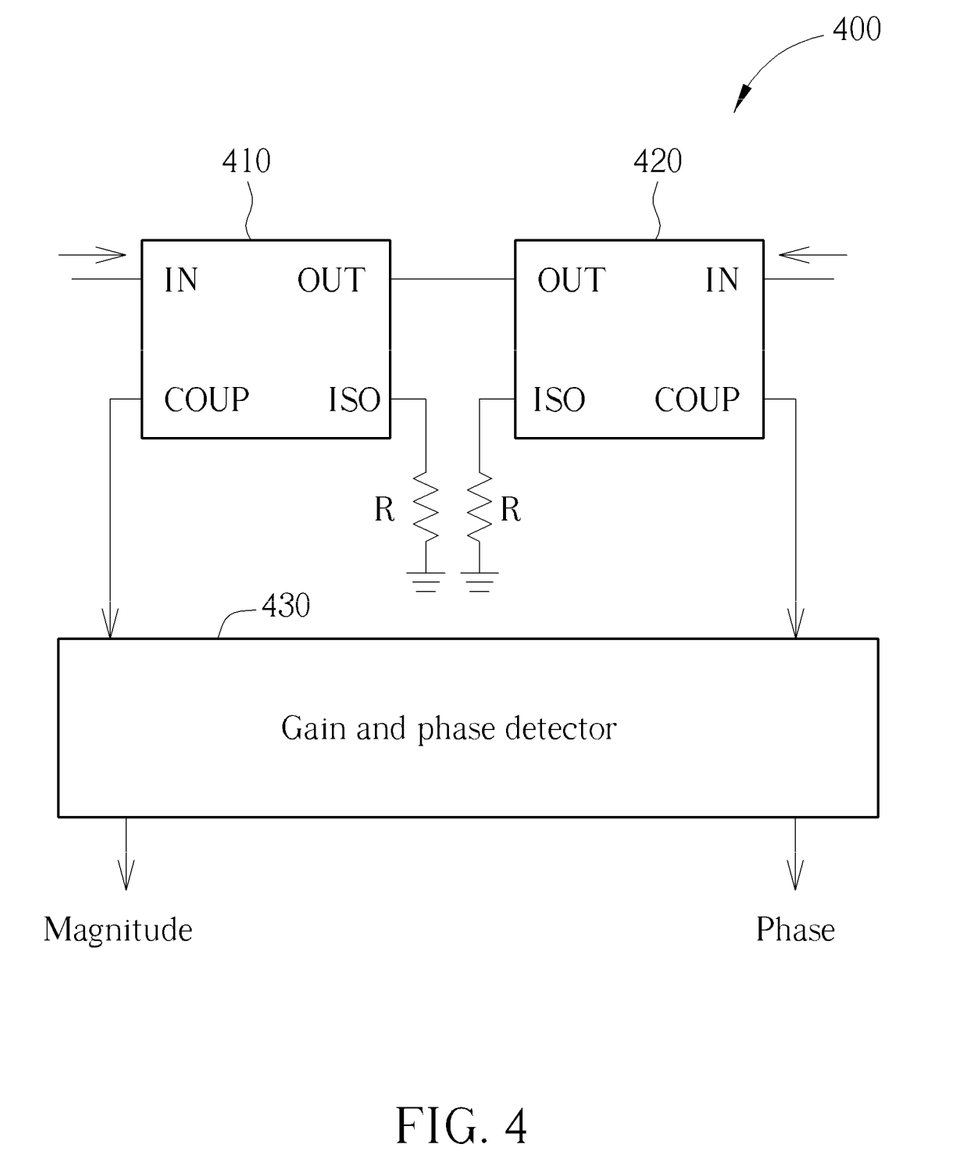
FIG. 4 is a diagram illustrating the impedance detector shown in FIG. 1 according to another embodiment of the present invention.

Please refer to FIG. 4, which is a diagram illustrating the impedance detector 400 according to another embodiment of the present invention, where the impedance detector 400 can be used to implement the impedance detector 180 shown in FIG. 1. As shown in FIG. 4, the impedance detector 400 includes two 3-port directional couplers 410 and 420 and a gain and phase detector 430, where a node OUT of the 3-port directional coupler 410 is connected to a node OUT of the 3-port directional coupler 420, and the nodes ISO of the 3-port directional couplers 410 and 420 are coupled to ground via resistors R. In the operations of the impedance detector 400 shown in FIG. 4, the 3-port directional coupler 410 receives a signal from the antenna 172 (via the tunable matching network 170) at a node IN, and outputs a coupled signal from a node COUP to the gain and phase detector 430. The 3-port directional coupler 420 receives a signal from the ASM 160 at a node IN, and outputs another coupled signal from a node COUP to the gain and phase detector 430. The gain and phase detector 430 then outputs magnitude and phase information to the baseband circuit 190, where the magnitude and phase information serves as the load impedance of the ASM 160

During the manufacture of a mobile phone, engineers in the factory build a look-up table by testing the wireless communications circuit 100, and store the look-up table into the memory 192. Input(s) of the look-up table may be operating condition(s) of the wireless communications circuit 100 such as a frequency of the wireless communications circuit 100 (i.e. a frequency of a signal sent out from the antenna 172), a supply voltage of the power amplifier module 120, an output power level of the power amplifier module 120, or any of their possible combinations; and an output of the look-up table may be an optimal load impedance of the power amplifier module 120, or any other information that can be used to represent the optimal load impedance of the power amplifier module 120. In addition, each of the channels (paths) shown in FIG. 1 may have its own look-up table.

Figure 5A:
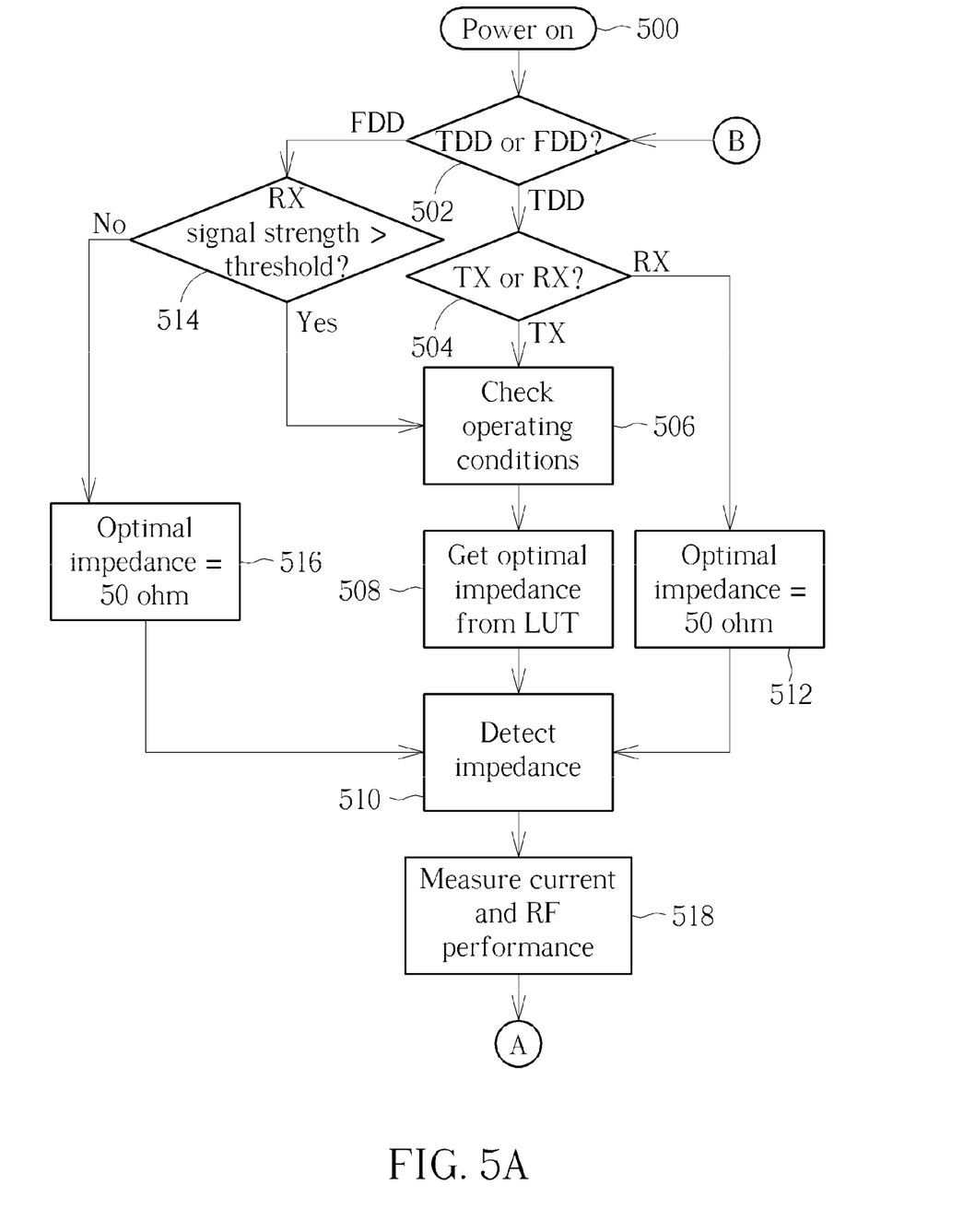
FIG. 5A and FIG. 5B show a flow chart of an impedance adjusting method of the wireless communications circuit shown in FIG. 1 according to one embodiment of the present invention.
Figure 5B:
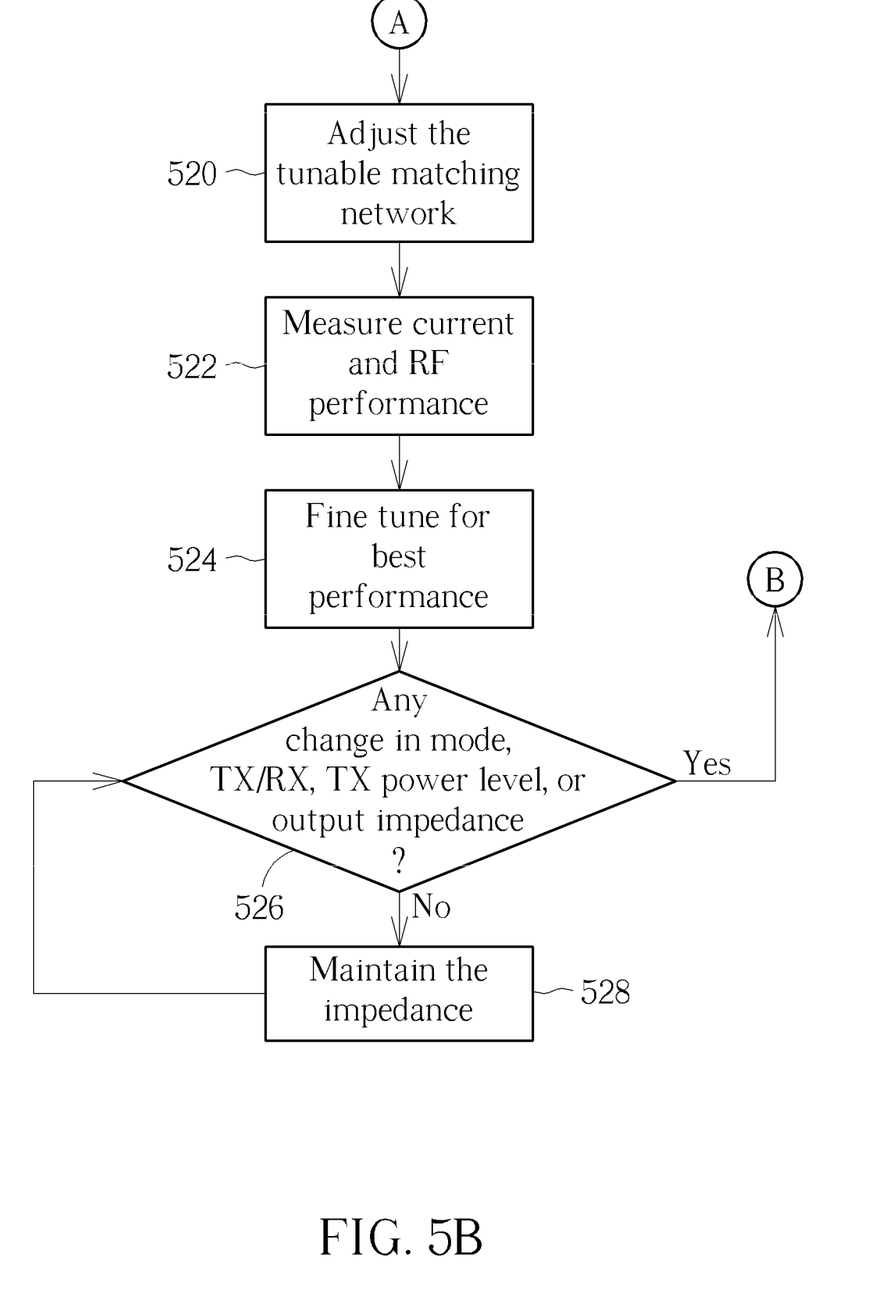

Please refer to FIG. 5A and FIG. 5B, which is a flow chart of an impedance adjusting method of the wireless communications circuit 100 according to one embodiment of the present invention. The flow shown in FIG. 5A and FIG. 5B is for illustrative purposes only. Provided the results are substantially the same, the steps are not limited to be executed according to the exact order shown in FIG. 5A and FIG. 5B, and the flow may add or ignore some steps without influencing the operations of the wireless communications circuit 100. Referring to FIG. 1 and FIG. 5A and FIG. 5B, the flow is described as follows.

In Step 500, the wireless communications circuit 100 is powered on. In Step 502, it is determined whether the wireless communications circuit 100 is operated under a time-division duplex (TDD) mode or a frequency-division duplex (FDD) mode. If the wireless communications circuit 100 is operated under the TDD mode, the flow enters Step 504; and if the wireless communications circuit 100 is operated under the FDD mode, the flow enters Step 514.

In Step 504, it is determined whether the wireless communications circuit 100 now serves as a transmitter (TX) or a receiver (RX). If the wireless communications circuit 100 now serves as the transmitter, the flow enters Step 506; otherwise the flow enters Step 512. In Step 506, the baseband circuit 190 checks operating conditions such as TX power level (i.e. the output power level of the power amplifier module 120) to be used, or a frequency of the wireless communications circuit 100 (i.e. a frequency of a signal sent out from the antenna 172) to be used, or a supply voltage of the power amplifier module 120, or any of their possible combinations to obtain a checking result. In Step 508, the baseband circuit 190 gets information about an optimal load impedance of the power amplifier module 120 from the look-up table stored in the memory 192 according to the checking result.

In Step 512 when the wireless communications circuit 100 serves as the receiver, the baseband circuit 190 directly sets the optimal load impedance of the power amplifier module 120 to be 50 ohms without referring to the look-up table stored in the memory 192. In Step 514 (the wireless communications circuit 100 is operated under the FDD mode), it is determined whether a signal strength (a power level) of a receiving signal of the wireless communications circuit 100 is greater than a threshold or not: if the signal strength is greater than the threshold (i.e. the signal is strong), the flow enters Step 506; and if the signal strength is not greater than the threshold (i.e. the signal is weak), the flow enters Step 516 and the baseband circuit 190 directly sets the optimal load impedance of the power amplifier module 120 to be 50 ohms without referring to the look-up table stored in the memory 192.

In Step 510, after the optimal load impedance of the power amplifier module 120 is determined, the impedance detector 180 detects the output impedance of the ASM 160. In Step 518, the baseband circuit 190 and transceiver 110 measure the current consumption and RF performance of the power amplifier module 120. In Step 520, because the load impedance of the power amplifier module 120 and the load impedance of the ASM 160 have a specific relationship (this relationship can be obtained in the factory), the baseband circuit 190 sends a control signal to the tunable matching network 170 to adjust the impedance of the tunable matching network 170 to make the load impedance of the power amplifier module 120 equal the optimal load impedance determined in Step 508, Step 512 or Step 516.

After the impedance of the tunable matching network 170 is adjusted to make the power amplifier module 120 have the optimal load impedance, in Step 522, the baseband circuit 190 and transceiver 110 measure the current consumption and RF performance of the power amplifier module 120 again to determine whether the current consumption and RF performance satisfy the requirement. In Step 524, the baseband circuit 190 fine-tunes the impedance of the tunable matching network 170 to make the power amplifier module 120 have the best performance.

In Step 526, it is determined if there is any change in mode (FDD or TDD), TX/RX, TX power level or load impedance of the ASM 160. If yes, the flow goes back to Step 502; otherwise the flow goes to Step 528 to maintain the impedance of the tunable matching network 170.

The advantages of the wireless communications circuit 100 are as follows: at the same output power of the power amplifier module 120, the TX current consumption of the power amplifier module 120 can be optimized by adjusting the impedance of the tunable matching network 170. It is easy to combine the present invention with the existing solutions (i.e. the averaging power tracking method and envelope tracking method described in the background) to get better current saving performance. The wireless communications circuit 100 can keep the TX power level with minimum variation when the loading (load impedance) is changed under wireless communications condition. Although the above disclosure focuses on the current consumption and performance of the power amplifier module 120, the TX performance and RF performance of the wireless communications circuit 100 can also be improved by adjusting the impedance of the tunable matching network 170. Because the impedance of the tunable matching network 170 can be adjusted to improve the RX RF performance, the quality of the transmitting signal is better and the antenna 172 can support a wide frequency range.

A real case is taken as an example herein to describe the current consumption improvement of the wireless communications circuit 100. For a 28 dBm output power case, the current of the power amplifier is 400 mA and the adjacent channel leakage ratio (ACLR) is (−43 dBc) when the load impedance of the power amplifier is equal to 50 ohm. When the wireless communications circuit 100 is operated under the wireless communications condition, however, the load impedance of the power amplifier may be time-varied, causing the following performance change: the output power of the power amplifier ranges from 17 dBm to 28 dBm, the current of the power amplifier ranges from 300 mA to 800 mA, and the ACLR ranges from (−20 dBc) to (−44 dBc). By using the load impedance adjusting method of the present invention, the baseband circuit 190 may adjust the tunable matching network 170 to make the load impedance of the power amplifier equal to (35-j10 ohms), the current of the power amplifier may be optimized to be 350 mA, and the other performance also satisfies the 3GPP specification.

Figure 6:
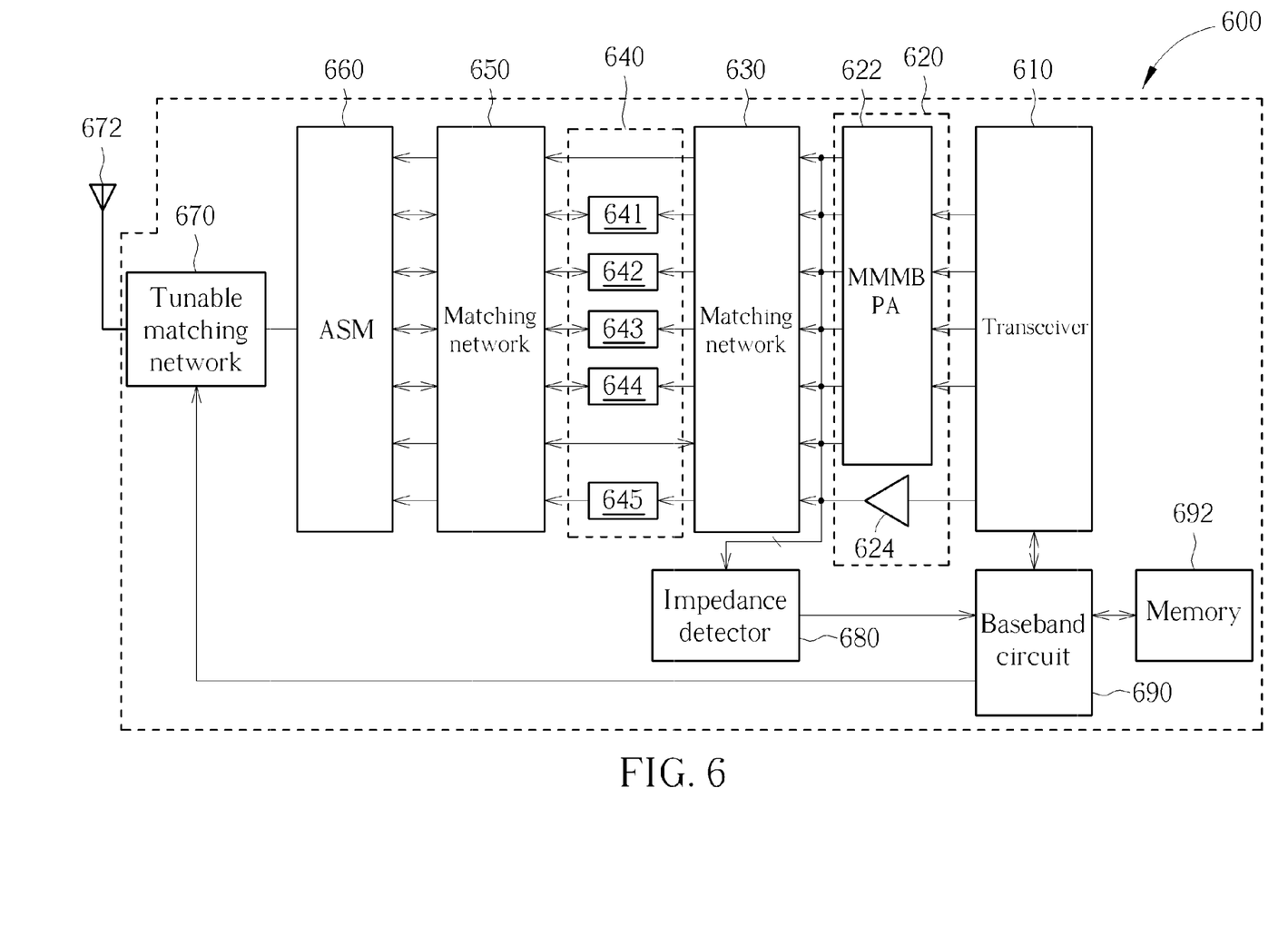
FIG. 6 is a diagram illustrating a wireless communications circuit according to another embodiment of the present invention.

Please refer to FIG. 6, which is a diagram illustrating a wireless communications circuit 600 according to another embodiment of the present invention. Referring to FIG. 6, the wireless communications circuit 600 comprises a transceiver 610, a power amplifier module 620 comprising a multi-mode/multi-band power amplifier (MMMB PA) 622 and a PA 624, a matching network 630, a filter module 640 comprising a plurality of filters (duplexers) 641-645, a matching network 650, an antenna switching module (ASM) 660, a tunable matching network 670, an impedance detector 680, a baseband circuit 690 and a memory 692. The wireless communications circuit 600 is connected to an antenna 672. In this embodiment, the wireless communications circuit 600 serves as a front end circuit of a 2G/3G/4G mobile phones. In other embodiments, the wireless communications circuit 600 can also be used in other communications systems such as Wireless Fidelity (WiFi) systems.

In this embodiment, the transceiver 610, the power amplifier module 620 and the baseband circuit 690 are three different chips, and the other elements can be implemented by chip(s), package(s) or other circuit elements positioned on a printed circuit board (PCB). In addition, in other embodiments, the transceiver 610, the power amplifier module 620 and the baseband circuit 690 can be integrated into a single chip, or any two of them are integrated into a chip. These alternative designs shall fall within the scope of the present invention.

In the wireless communication circuit 600 shown in FIG. 6, there are a plurality of channels for different bands. For example, the MMMB PA 612 has six power amplifiers built therein and has six outputs, where these amplifiers can be used for 2G high-band, 3G/4G high-band, 3G/4G low-band, 2G low-band etc. The matching network 630 has seven groups of matching circuits for impedance matching of the power amplifier module 620. Similarly, the matching network 650 has seven groups of matching circuits for impedance matching of the filter module 640. The ASM 660 is used to connect one of the channels to the antenna 672 via the tunable matching network 170.

The matching network 630 and 650 are optional devices; that is, one or both can be removed from the wireless communication circuit 600 without influencing the normal operations of the wireless communication circuit 600.

The tunable matching network 670 can be implemented by using switchable step capacitors and inductors shown in FIG. 2 or any other tunable capacitors or tunable inductors. The impedance detector 680 can be implemented by using a plurality of impedance detectors 300 as shown in FIG. 3 or a plurality of impedance detectors 400 as shown in FIG. 4 (in the embodiment shown in FIG. 6, there are seven impedance detectors 300/400 built in the impedance detector 680).

During manufacture of the mobile phone, engineers in the factory build a look-up table by testing the wireless communication circuit 600, and then store the look-up table into the memory 692. Input(s) of the look-up table may be a frequency of the wireless communication circuit 600 (i.e. a frequency of a signal sent out from the antenna 672), a supply voltage of the power amplifier module 620, an output power level of the power amplifier module 620, or any of their possible combinations; and an output of the look-up table may be an optimal load impedance of the power amplifier module 620, or any other information that can be used to represent the optimal load impedance of the power amplifier module 620. In addition, each of the channels (paths) shown in FIG. 6 may have its own look-up table.

Regarding the operations of the wireless communication circuit 600, the impedance adjusting method of the wireless communication circuit 600 can also be illustrated by the flow shown in FIG. 5A and FIG. 5B. The difference between the wireless communications circuit 600 shown in FIG. 6 and the wireless communications circuit 100 shown in FIG. 1 is that, in Step 510, the impedance detector 680 detects the load impedance of the power amplifier module 620. Because a person skilled in this art should understand the operations of the wireless communication circuit 600 after reading the above-mentioned disclosure about the wireless communications circuit 100, further descriptions are omitted here.

Figure 7:
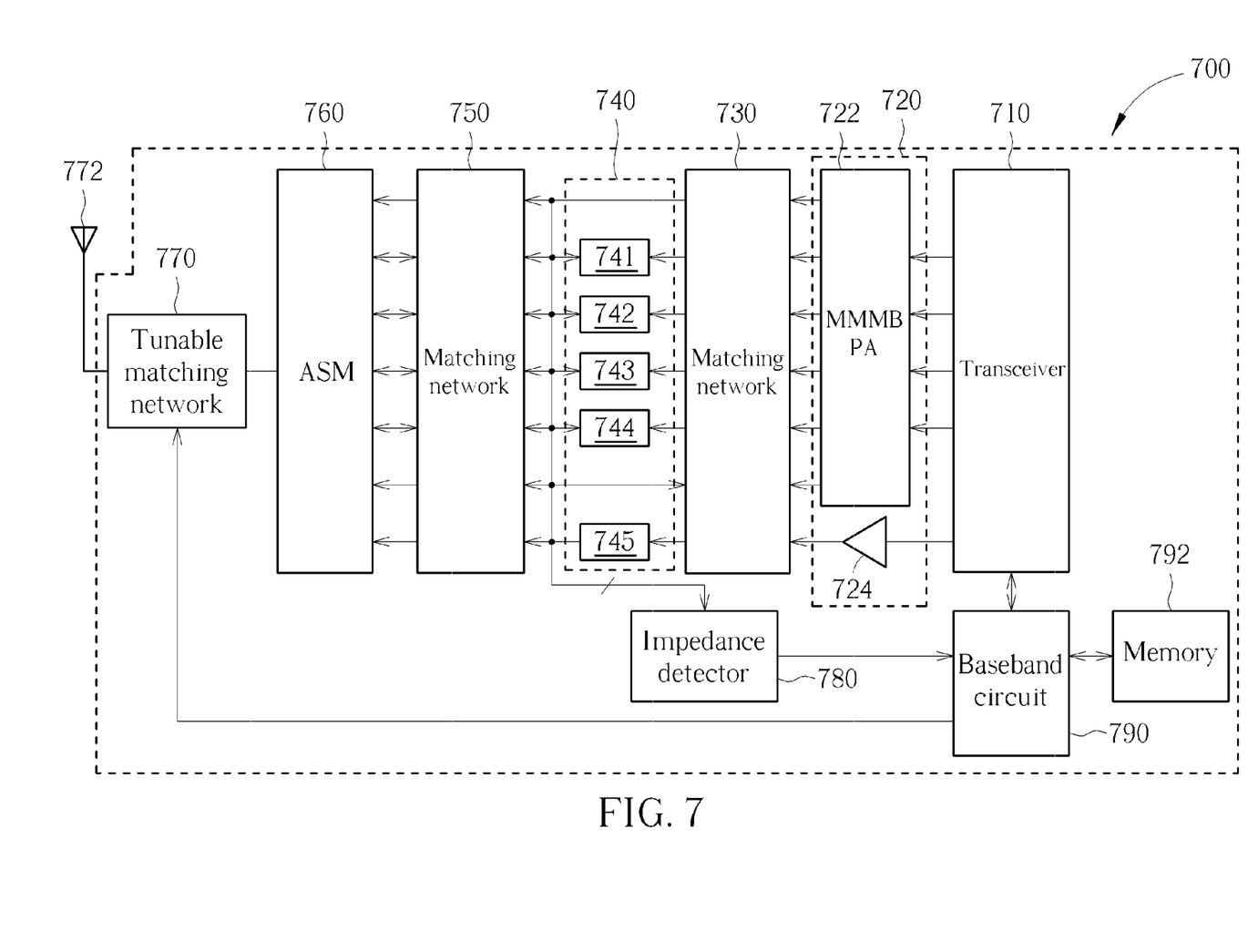
FIG. 7 is a diagram illustrating a wireless communications circuit according to another embodiment of the present invention.

Please refer to FIG. 7, which is a diagram illustrating a wireless communications circuit 700 according to another embodiment of the present invention. Referring to FIG. 7, the wireless communications circuit 700 comprises a transceiver 710, a power amplifier module 720 comprising a multi-mode/multi-band power amplifier (MMMB PA) 722 and a PA 724, a matching network 730, a filter module 740 comprising a plurality of filters (duplexers) 741-745, a matching network 750, an antenna switching module (ASM) 760, a tunable matching network 770, an impedance detector 780, a baseband circuit 790 and a memory 792. The wireless communications circuit 700 is connected to an antenna 772. In this embodiment, the wireless communications circuit 700 serves as a front end circuit of a 2G/3G/4G mobile phones. In other embodiments, the wireless communications circuit 700 can also be used in other communications systems such as Wireless Fidelity (WiFi) systems.

In this embodiment, the transceiver 710, the power amplifier module 720 and the baseband circuit 790 are three different chips, and the other elements can be implemented by chip(s), package(s) or other circuit elements positioned on a printed circuit board (PCB). In addition, in other embodiments, the transceiver 710, the power amplifier module 720 and the baseband circuit 790 can be integrated into a single chip, or any two of them are integrated into a chip. These alternative designs shall fall within the scope of the present invention.

In the wireless communication circuit 700 shown in FIG. 7, there are a plurality of channels for different bands. For example, the MMMB PA 712 has six power amplifiers built therein and has six outputs, where these amplifiers can be used for 2G high-band, 3G/4G high-band, 3G/4G low-band, 2G low-band etc. The matching network 730 has seven groups of matching circuits for impedance matching of the power amplifier module 720. Similarly, the matching network 750 has seven groups of matching circuits for impedance matching of the filter module 740. The ASM 760 is used to connect one of the channels to the antenna 772 via the tunable matching network 770.

The matching network 730 and 750 are optional devices; that is, one or both can be removed from the wireless communication circuit 700 without influencing the normal operations of the wireless communication circuit 700.

The tunable matching network 770 can be implemented by using switchable step capacitors and inductors as shown in FIG. 2 or any other tunable capacitors or tunable inductors. The impedance detector 780 can be implemented by using a plurality of impedance detectors 300 as shown in FIG. 3 or a plurality of impedance detectors 400 as shown in FIG. 4 (in the embodiment shown in FIG. 7, there are seven impedance detectors 300/400 built in the impedance detector 780).

During manufacture of the mobile phone, engineers in the factory build a look-up table by testing the wireless communication circuit 700, then store the look-up table into the memory 792. Input(s) of the look-up table may be a frequency of the wireless communication circuit 700 (i.e. a frequency of a signal sent out from the antenna 772), a supply voltage of the power amplifier module 720, an output power level of the power amplifier module 720, or any of their possible combinations; and an output of the look-up table may be an optimal load impedance of the power amplifier module 720, or any other information that can be used to represent the optimal load impedance of the power amplifier module 720. In addition, each of the channels (paths) shown in FIG. 7 may have its own look-up table.

Regarding the operations of the wireless communications circuit 700, the impedance adjusting method of the wireless communications circuit 700 can also be illustrated by the flow shown in FIG. 5A and FIG. 5B. The difference between the wireless communication circuit 700 shown in FIG. 7 and the wireless communication circuit 100 shown in FIG. 1 is that, in Step 510, the impedance detector 780 detects the load impedance of the filter module 740. Because the relationship between the load impedances of the ASM 760, filter module 740 and the power amplifier module 720 can be obtained in the factory, the baseband circuit 790 can use the detected load impedance of the filter module 740 to adjust the impedance of the tunable matching network 770 to make the load impedance of the power amplifier module 720 equal to the optimal load impedance determined in Step 508, 512 or 516. Because a person skilled in this art should understand the operations of the wireless communication circuit 700 after reading the above-mentioned disclosure about the wireless communication circuit 100, further descriptions are omitted here.

Briefly summarized, in the wireless communications circuit of the present invention, the load impedance of the power amplifier module can be adjusted according to TX output power and/or other conditions of the wireless communication circuit. The current consumption of the power amplifier module can therefore be optimized to extend the battery usage time, and the RF performance of the power amplifier module can also be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communications circuit, comprising:
a transceiver;
a power amplifier module, comprising a plurality of power amplifiers coupled to the transceiver;
a filter module, comprising a plurality of filters coupled to the power amplifier module, for filtering at least a portion of outputs of the power amplifiers;
an antenna switching module, coupled between the filter module and an antenna;
a tunable matching network, coupled between the antenna and the antenna switching module;
a baseband circuit, coupled to the tunable matching network, for generating a control signal to the tunable matching network to adjust an impedance of the tunable matching network, wherein the impedance of the tunable matching network is adjusted to be different values under different operating conditions of the wireless communications circuit; and
an impedance detector, for detecting a load impedance of the antenna switching module to generate a detecting result;
wherein the baseband circuit generates the control signal to the tunable matching network to adjust the impedance of the tunable matching network according to the detecting result.

2. A wireless communications circuit, comprising:
a transceiver;
a power amplifier module, comprising a plurality of power amplifiers coupled to the transceiver;
a filter module, comprising a plurality of filters coupled to the power amplifier module, for filtering at least a portion of outputs of the power amplifiers;
an antenna switching module, coupled between the filter module and an antenna;
a tunable matching network, coupled between the antenna and the antenna switching module;
a baseband circuit, coupled to the tunable matching network, for generating a control signal to the tunable matching network to adjust an impedance of the tunable matching network, wherein the impedance of the tunable matching network is adjusted to be different values under different operating conditions of the wireless communications circuit; and
an impedance detector, for detecting a load impedance of the filter module to generate a detecting result;
wherein the baseband circuit generates the control signal to the tunable matching network to adjust the impedance of the tunable matching network according to the detecting result.

3. A wireless communications circuit, comprising:
a transceiver;
a power amplifier module, comprising a plurality of power amplifiers coupled to the transceiver;
a filter module, comprising a plurality of filters coupled to the power amplifier module, for filtering at least a portion of outputs of the power amplifiers;
an antenna switching module, coupled between the filter module and an antenna;
a tunable matching network, coupled between the antenna and the antenna switching module;
a baseband circuit, coupled to the tunable matching network, for generating a control signal to the tunable matching network to adjust an impedance of the tunable matching network, wherein the impedance of the tunable matching network is adjusted to be different values under different operating conditions of the wireless communications circuit; and
an impedance detector, for detecting a load impedance of the wireless communication circuit to generate a detecting result;
wherein the baseband circuit generates the control signal to the tunable matching network to adjust the impedance of the tunable matching network according to the detecting result;
wherein the baseband circuit determines an optimal load impedance of the power amplifier module from a look-up table, and the baseband circuit generates the control signal to the tunable matching network to adjust the impedance of the tunable matching network according to the optimal load impedance and the detecting result to make an load impedance of the power amplifier module equal to the optimal load impedance of the power amplifier module.

4. A wireless communications circuit, comprising:
a transceiver;
a power amplifier module, comprising a plurality of power amplifiers coupled to the transceiver;
a filter module, comprising a plurality of filters coupled to the power amplifier module, for filtering at least a portion of outputs of the power amplifiers;
an antenna switching module, coupled between the filter module and an antenna;
a tunable matching network, coupled between the antenna and the antenna switching module;
a baseband circuit, coupled to the tunable matching network, for generating a control signal to the tunable matching network to adjust an impedance of the tunable matching network, wherein the impedance of the tunable matching network is adjusted to be different values under different operating conditions of the wireless communications circuit; and
an impedance detector, for detecting an impedance of the wireless communications circuit to generate a detecting result;
wherein when the wireless communications circuit is operated under a frequency-division duplex (FDD) mode and a signal quality of a receiving signal of the wireless communications circuit is greater than a threshold, the baseband circuit generates the control signal to the tunable matching network to adjust the impedance of the tunable matching network according to the detecting result; and
when the wireless communications circuit is operated under the FDD mode and the signal quality of the receiving signal of the wireless communications circuit is not greater than the threshold, the baseband circuit refers the detecting result to generate the control signal to the tunable matching network to adjust the impedance of the tunable matching network to make an load impedance of the power amplifier module always equal to a predetermined impedance.

5. A wireless communications circuit, comprising:
a transceiver;
a power amplifier module, comprising a plurality of power amplifiers coupled to the transceiver;
a filter module, comprising a plurality of filters coupled to the power amplifier module, for filtering at least a portion of outputs of the power amplifiers;
an antenna switching module, coupled between the filter module and an antenna;
a tunable matching network, coupled between the antenna and the antenna switching module;

a baseband circuit, coupled to the tunable matching network, for generating a control signal to the tunable matching network to adjust an impedance of the tunable matching network, wherein the impedance of the tunable matching network is adjusted to be different values under different operating conditions of the wireless communications circuit; and an impedance detector, for detecting an impedance of the wireless communications circuit to generate a detecting result;

wherein when the wireless communication circuit is operated under a time-division duplex (TDD) mode and serves as a transmitter, the baseband circuit generates the control signal to the tunable matching network to adjust the impedance of the tunable matching network according to the detecting result; and when the wireless communications circuit is operated under the TDD mode and serves as a receiver, the baseband circuit refers the detecting result to generate the control signal to the tunable matching network to adjust the impedance of the tunable matching network to make an load impedance of the power amplifier module always equal to a predetermined impedance.

6. An impedance adjusting method of a wireless communications circuit, wherein the wireless communications circuit comprises:

a transceiver;

a power amplifier module, comprising a plurality of power amplifiers coupled to the transceiver;

a filter module, comprising a plurality of filters coupled to the power amplifier module, for filtering at least a portion of outputs of the power amplifiers;

an antenna switching module, coupled between the filter module and an antenna; and a tunable matching network, coupled between the antenna and the antenna switching module; and the impedance adjusting method comprises:

detecting a load impedance of the antenna switching module to generate a detecting result;

generating a control signal according to the detecting result; and sending the control signal to the tunable matching network to adjust an impedance of the tunable matching network;

wherein the impedance of the tunable matching network is adjusted to be different values under different operating conditions of the wireless communication circuit.

7. An impedance adjusting method of a wireless communications circuit, wherein the wireless communications circuit comprises:

a transceiver;

a power amplifier module, comprising a plurality of power amplifiers coupled to the transceiver;

a filter module, comprising a plurality of filters coupled to the power amplifier module, for filtering at least a portion of outputs of the power amplifiers;

an antenna switching module, coupled between the filter module and an antenna; and a tunable matching network, coupled between the antenna and the antenna switching module; and the impedance adjusting method comprises:

detecting a load impedance of the filter module to generate a detecting result;

generating a control signal according to the detecting result; and sending the control signal to the tunable matching network to adjust an impedance of the tunable matching network;

wherein the impedance of the tunable matching network is adjusted to be different values under different operating conditions of the wireless communication circuit.

8. An impedance adjusting method of a wireless communications circuit, wherein the wireless communications circuit comprises:

a transceiver;

a power amplifier module, comprising a plurality of power amplifiers coupled to the transceiver;

a filter module, comprising a plurality of filters coupled to the power amplifier module, for filtering at least a portion of outputs of the power amplifiers;

an antenna switching module, coupled between the filter module and an antenna; and a tunable matching network, coupled between the antenna and the antenna switching module; and the impedance adjusting method comprises:

detecting a load impedance of the wireless communications circuit to generate a detecting result;

determining an optimal impedance of the power amplifier module from a look-up table;

generating a control signal according to the optimal impedance and the detecting result; and sending the control signal to the tunable matching network to adjust an impedance of the tunable matching network to make an load impedance of the power amplifier module equal to the optimal load impedance of the power amplifier module, wherein the impedance of the tunable matching network is adjusted to be different values under different operating conditions of the wireless communication circuit.

9. An impedance adjusting method of a wireless communications circuit, wherein the wireless communications circuit comprises:

a transceiver;

a power amplifier module, comprising a plurality of power amplifiers coupled to the transceiver;

a filter module, comprising a plurality of filters coupled to the power amplifier module, for filtering at least a portion of outputs of the power amplifiers;

an antenna switching module, coupled between the filter module and an antenna; and a tunable matching network, coupled between the antenna and the antenna switching module; and the impedance adjusting method comprises:

detecting an impedance of the wireless communications circuit to generate a detecting result;

generating a control signal according to the detecting result;

sending the control signal to the tunable matching network to adjust an impedance of the tunable matching network, wherein the impedance of the tunable matching network is adjusted to be different values under different operating conditions of the wireless communication circuit;

when the wireless communications circuit is operated under a frequency-division duplex (FDD) mode and a signal quality of a receiving signal of the wireless communications circuit is greater than a threshold, generating the control signal to the tunable matching network to adjust the impedance of the tunable matching network according to the detecting result; and when the wireless communications circuit is operated under the FDD mode and the signal quality of the receiving signal of the wireless communications circuit is not greater than the threshold, referring to the detecting result to generate the control signal to the tunable matching network to adjust the impedance of the tunable matching network to make an load impedance of the power amplifier module always equal to a predetermined impedance.

10. An impedance adjusting method of a wireless communications circuit, wherein the wireless communications circuit comprises:

a transceiver;

a power amplifier module, comprising a plurality of power amplifiers coupled to the transceiver;

a filter module, comprising a plurality of filters coupled to the power amplifier module, for filtering at least a portion of outputs of the power amplifiers;

an antenna switching module, coupled between the filter module and an antenna; and a tunable matching network, coupled between the antenna and the antenna switching module; and the impedance adjusting method comprises:

detecting an impedance of the wireless communications circuit to generate a detecting result;

generating a control signal according to the detecting result;

sending the control signal to the tunable matching network to adjust an impedance of the tunable matching network, wherein the impedance of the tunable matching network is adjusted to be different values under different operating conditions of the wireless communication circuit;

when the wireless communications circuit is operated under a time-division duplex (TDD) mode and serves as a transmitter, generating the control signal to the tunable matching network to adjust the impedance of the tunable matching network according to the detecting result; and when the wireless communications circuit is operated under the TDD mode and serves as a receiver, referring to the detecting result to generate the control signal to the tunable matching network to adjust the impedance of the tunable matching network to make an load impedance of the power amplifier module always equal to a predetermined impedance.

\* \* \* \* \*